United States Patent
Merchant et al.

(10) Patent No.: US 9,112,060 B2
(45) Date of Patent: Aug. 18, 2015

(54) LOW-LEAKAGE, HIGH-CAPACITANCE CAPACITOR STRUCTURES AND METHOD OF MAKING

(75) Inventors: Tushar P. Merchant, Austin, TX (US); Michael A. Sadd, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 696 days.

(21) Appl. No.: 13/070,049

(22) Filed: Mar. 23, 2011

(65) Prior Publication Data
US 2012/0241909 A1 Sep. 27, 2012

(51) Int. Cl.
*H01L 21/02* (2006.01)
*H01L 49/02* (2006.01)
*H01L 29/94* (2006.01)

(52) U.S. Cl.
CPC ............... *H01L 28/92* (2013.01); *H01L 29/94* (2013.01)

(58) Field of Classification Search
CPC .... H01L 21/86; H01L 27/912; H01L 23/5223
See application file for complete search history.

(56) References Cited

U.S. PATENT DOCUMENTS

| | | | |
|---|---|---|---|
| 4,914,546 A | 4/1990 | Alter | |
| 5,166,858 A | 11/1992 | Frake et al. | |
| 5,208,725 A | 5/1993 | Akcasu | |
| 5,464,791 A * | 11/1995 | Hirota | 438/253 |
| 5,595,928 A | 1/1997 | Lu et al. | |
| 5,773,871 A * | 6/1998 | Boyd et al. | 257/532 |
| 5,789,289 A | 8/1998 | Jeng | |
| 6,259,149 B1 * | 7/2001 | Burkhardt et al. | 257/534 |
| 6,294,420 B1 | 9/2001 | Tsu et al. | |
| 6,507,063 B2 | 1/2003 | Coolbaugh et al. | |
| 2002/0014646 A1 | 2/2002 | Tsu et al. | |
| 2003/0094708 A1 * | 5/2003 | Itou | 257/916 |
| 2008/0186648 A1 * | 8/2008 | Choi et al. | 361/305 |
| 2009/0108403 A1 * | 4/2009 | Gogoi | 257/532 |

OTHER PUBLICATIONS

Sowlati et al.; "High Density Capacitance Structures in Submicron CMOS for Low Power RF Applications"; International Symposium on Low Power Electronics and Design; 2001; pp. 243-246; IEEE.

* cited by examiner

*Primary Examiner* — Zandra Smith
*Assistant Examiner* — Andre' C Stevenson
(74) *Attorney, Agent, or Firm* — Jonathan N. Geld; Joanna G. Chiu

(57) ABSTRACT

A process and device structure is provided for increasing capacitance density of a capacitor structure. A sandwich capacitor is provided in which a bottom silicon-containing conductor plate is formed with holes or cavities, upon which an oxide layer and a top silicon-containing layer conductor is formed. The holes or cavities provide additional capacitive area, thereby increasing capacitance per footprint area of the capacitor structure. The holes can form, for example, a line structure or a waffle-like structure in the bottom conductor plate. Etching techniques used to form the holes in the bottom conductor plate can also result in side wall tapering of the holes, thereby increasing the surface area of the silicon-containing layer defined by the holes. In addition, depth of holes can be adjusted through timed etching to further adjust capacitive area.

17 Claims, 4 Drawing Sheets

LOW-LEAKAGE, HIGH-CAPACITANCE CAPACITOR STRUCTURES AND METHOD OF MAKING

BACKGROUND

1. Field

The field of the present invention relates generally to semiconductor devices and processing thereof, and more specifically to a capacitor structure and a process for making the capacitor structure resulting in increased capacitance per unit area.

2. Related Art

As semiconductor device features are reduced to smaller dimensions, issues can arise with regard to capacitance per unit area of capacitor structures. For example, gate oxide layers have been reduced in thickness to the point that gate leakage increases. In order to overcome such leakage problems, thicker oxide layers (e.g., high voltage capacitors) are traditionally used which results in lower capacitance per area and potentially additional processing steps.

It is desirable to use existing processing steps, including masking, to provide improved capacitance density in capacitor structures used as, for example, decoupling capacitors, op-amp compensation capacitors, and the like.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. It should be noted that the layers and structures depicted in the figures are not necessarily drawn to scale. In particular, the dimensions of layers and structures may be distorted to emphasize the fabrication of the topographies and, consequently, should not be restricted to the depictions of the drawings.

DETAILED DESCRIPTION

Embodiments of the present invention provide a process and device structure for increasing capacitance density of a capacitor structure. Embodiments provide a sandwich capacitor in which a bottom silicon-containing conductor plate is formed with holes or cavities, upon which an oxide layer and a top silicon-containing layer conductor is formed. The holes or cavities provide additional capacitive area, thereby increasing capacitance per footprint area of the capacitor structure. The holes can form, for example, a line structure or a waffle-like structure in the bottom conductor plate. Etching techniques used to form the holes in the bottom conductor plate can also result in side wall tapering of the holes, thereby increasing the surface area of the silicon-containing layer defined by the holes. In addition, depth of holes can be adjusted through timed etching to further adjust capacitive area. Capacitor structures of the present invention can be formed with a substrate and the top silicon-containing layer as voltage tied terminals while the bottom silicon-containing layer is at a different voltage.

Figure 1:
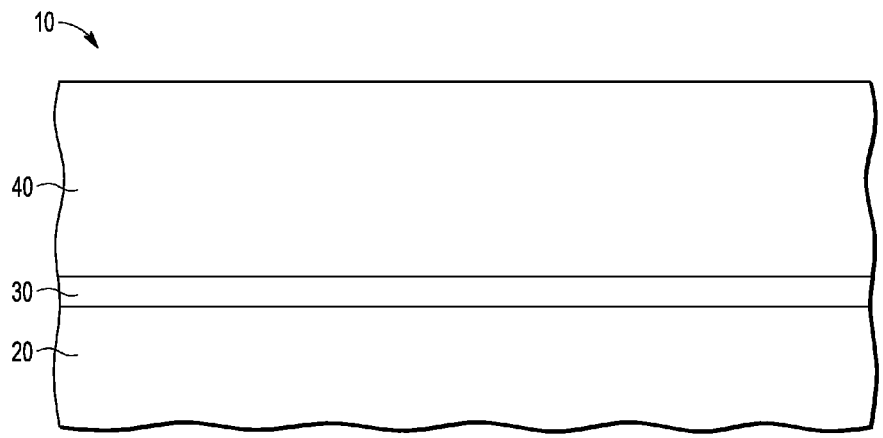
FIG. 1 is a simplified block diagram illustrating a capacitor structure at a stage in processing, according to one embodiment of the present invention.

FIG. 1 is a simplified block diagram illustrating a capacitor structure 10 at a stage in processing, according to one embodiment of the present invention. Capacitor structure 10 is formed on a semiconductor substrate 20. Semiconductor substrate 20 described herein can be any semiconductor material or combinations of materials, such as silicon, monocrystalline silicon, gallium arsenide, silicon germanium, silicon-on-insulator (SOI), and the like, and combinations of the above.

A dielectric layer 30 is formed above the semiconductor substrate. Dielectric layer 30 can be formed by an oxidation process commonly used for dielectric materials. Dielectric materials can include, for example, silicon dioxide, silicon nitride, silicon oxynitride, oxide-nitride-oxide (ONO), or any combination of such layers to provide electrical isolation between semiconductor substrate 20 and a conductive layer subsequently formed on dielectric layer 30. Selection of the dielectric material depends on the design specifications for the devices in which the capacitor structure is used. In some cases, dielectric layer 30 can be thermally grown from semiconductor substrate 20 using an oxidizing or nitridizing ambient. In other embodiments, dielectric layer 30 can be deposited using a conventional or proprietary chemical vapor deposition ("CVD") technique, physical vapor deposition ("PVD") technique, or any combination thereof. In either case, an exemplary range of thickness for dielectric layer 30 may generally be between approximately 100 and 150 angstroms. Larger or smaller thicknesses for dielectric layer 30, however, may be employed depending on the design specifications of the ensuing devices.

A silicon-containing conductive layer 40 is formed above dielectric layer 30. The silicon-containing conductive layer includes materials such as, for example, amorphous silicon and polysilicon. A typical silicon-containing conductive layer 40 has a thickness of 800 angstroms or greater. Thickness of the silicon-containing conductive layer 40 depends on the design specifications of the ensuing devices. Silicon-containing conductive layer 40 can be deposited using a conventional or proprietary technique, such as CVD, PVD, and the like.

Figure 2:
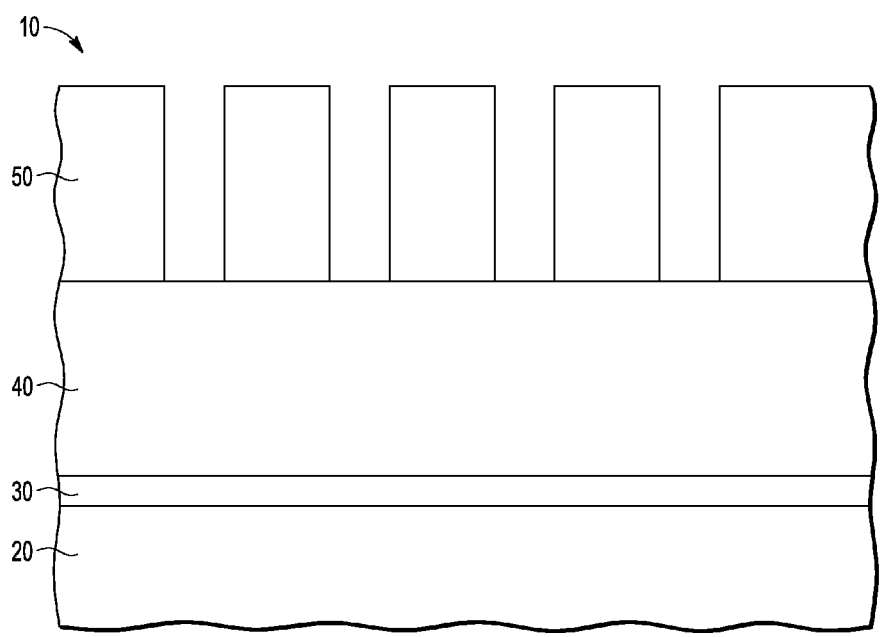
FIG. 2 is a simplified block diagram illustrating the capacitor structure at a stage in processing subsequent to that of FIG. 1, according to one embodiment of the present invention.

FIG. 2 is a simplified block diagram illustrating capacitor structure 10 at a stage in processing subsequent to that of FIG. 1, according to one embodiment of the present invention. A mask layer 50 is deposited over capacitor structure 10. Mask layer 50 can include one or more layers, and can include, for example, hardmask (e.g., nitride and nanocrystals) and photoresist materials. Mask layer 50 can be patterned using conventional processes. In one embodiment, mask layer 50 is used to etch underlying silicon-containing conductive layer 40 to form regularly-spaced holes. Etching can be performed using one of a dry etch or a wet etch process.

Figure 3:
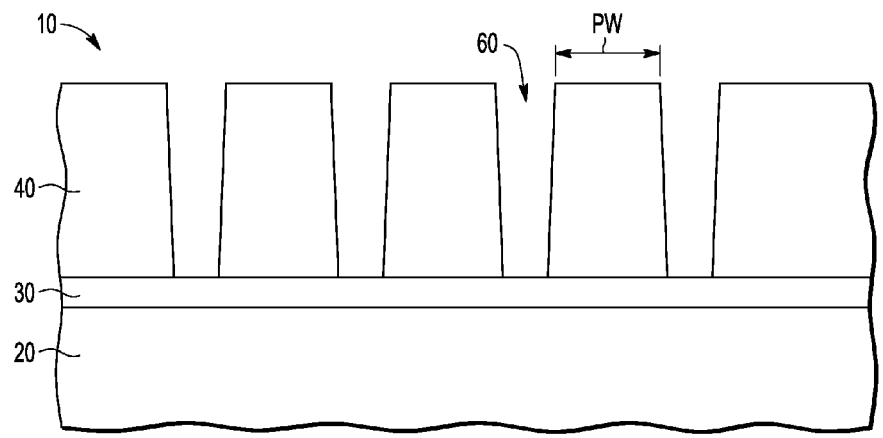
FIG. 3 is a simplified block diagram illustrating the capacitor structure at a stage in processing subsequent to that of FIG. 2, according to one embodiment of the present invention.

FIG. 3 is a simplified block diagram illustrating capacitor structure 10 at a stage in processing subsequent to that of FIG. 2, according to one embodiment of the present invention. Capacitor structure 10 is shown after performing an etch process using mask layer 50 in FIG. 2. The etch process removes portions of silicon-containing conductive layer 40, forming holes in the silicon-containing conductive layer (e.g., hole 60). The regularly-spaced holes described above result in regularly formed structures in the silicon-containing conductive layer having a top width, PW. In one embodiment, the side walls of the silicon-containing conductive layer structures taper outwardly toward the bottom of the formed hole. The amount of taper in the hole is controllable by known etching techniques to modify capacitive characteristics of the capacitor structure 10. In one embodiment, tapering of the hole can be performed such that the walls of the hole form a "V" shape coming to a point touching dielectric layer 30. As illustrated in FIG. 3, the hole depth extends to dielectric layer 30, the etch therefore removing the silicon-containing conductive layer for the complete depth of the hole. In another embodiment of the present invention, as will be discussed more fully below, the depth of the hole can be controlled through a timed etching process.

Figure 4:
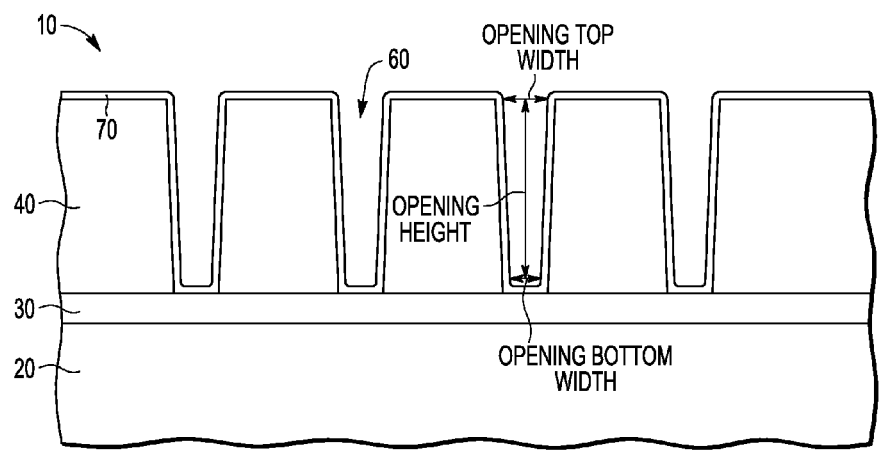
FIG. 4 is a simplified block diagram illustrating the capacitor structure at a stage in processing subsequent to that of FIG. 3, according to one embodiment of the present invention.

FIG. 4 is a simplified block diagram illustrating capacitor structure 10 at a stage in processing subsequent to that of FIG. 3, according to one embodiment of the present invention. A second dielectric layer 70 is formed over capacitor structure 10. Dielectric layer 70 covers the top of silicon-containing conductive layer 40, the side walls and bottom of holes 60. Dielectric layer 70 can be formed using one or more of the materials described for dielectric layer 30 (e.g., ONO), and can include the same or different materials as dielectric layer 30, depending upon the design specifications for the ensuing device. Typical thicknesses of dielectric layer 70 can be approximately 100-150 angstroms. Dielectric layer 70 can also be formed using one of the same methods described for dielectric layer 30. For example, an ONO dielectric layer 70 can be formed by forming a first oxide layer over silicon-containing conductive layer 40, forming a nitride layer over the first oxide layer, and then forming a second oxide layer over the nitride layer.

Holes 60 can be described by their dimensions after coating the capacitor structure with dielectric layer 70. Holes 60 have an opening top width defined as a distance between the edges of the dielectric layer on either side of the opening at the top of the hole. Holes 60 have an opening bottom width defined as a distance between the edges of the dielectric layer on either side of the opening at the bottom of the hole. Holes 60 have an opening height defined as a distance between the top of the dielectric layer deposited at the bottom of the hole and the top of the dielectric layer deposited on the top surface of silicon-containing conductive layer 40.

Embodiments of the present invention have an opening height measurement that is greater than or equal to the opening top width measurement. In one embodiment of the present invention, the opening height measurement is greater than or equal to twice that of the opening top width. In another embodiment, using 55 nm process technology, the opening height measurement is greater than or equal to 1.5 times that of the opening top width. In embodiments of the present invention, the opening top width is greater than or equal to approximately two times the depth of dielectric layer 70. This ensures that coating the hole with dielectric layer 70 does not fill the hole, so as to realize benefits of the presence of the holes, as described more fully below.

Figure 5:
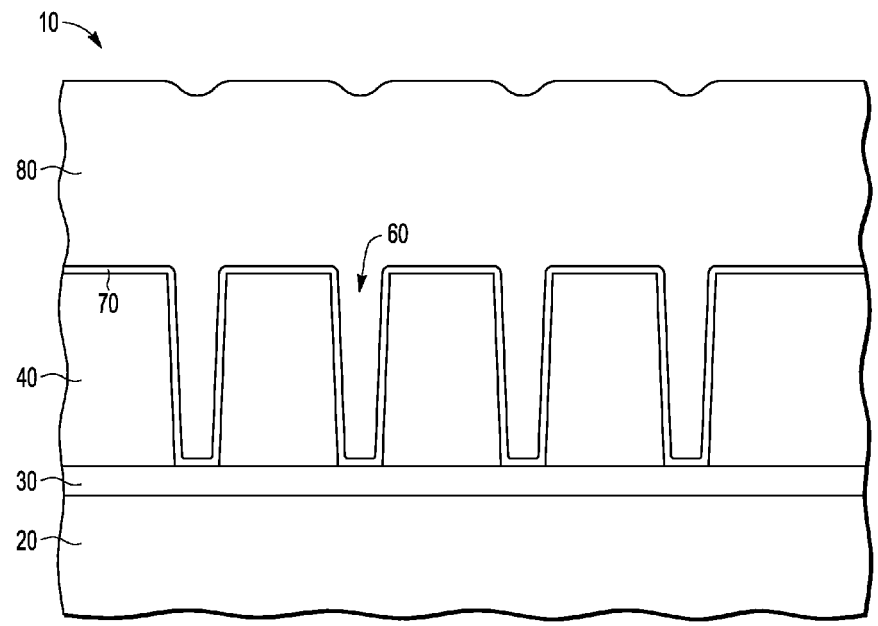
FIG. 5 is a simplified block diagram illustrating the capacitor structure at a stage in processing subsequent to that of FIG. 4, according to one embodiment of the present invention.

FIG. 5 is a simplified block diagram illustrating capacitor structure 10 at a stage in processing subsequent to that of FIG. 4, according to one embodiment of the present invention. A second silicon-containing conductive layer 80 is formed on top of dielectric layer 70. Silicon-containing conductive layer 80 is formed to a thickness comparable to that of silicon-containing conductive layer 40 (e.g., greater than or equal to approximately 800 angstroms), and coats the entirety of capacitor structure 10, including filling holes 60. Silicon-containing conductive layer 80 can be formed using one or more of the materials described for silicon-containing conductive layer 40, and can include the same or different materials as silicon-containing conductive layer 40. Silicon-containing conductive layer 80 can also be formed using one of the same methods described for silicon-containing conductive layer 40.

It should be realized that there are two capacitive regions defined by the layers illustrated in FIG. 5. A first capacitive region is defined between substrate 20 and silicon-containing conductive layer 40 having dielectric layer 30 as a coupling region. A second capacitive region is defined between silicon-containing conductive layer 40 and silicon-containing conductive layer 80 having dielectric layer 70 as a coupling region. These two capacitances are parallel, at least in part, to one another.

Capacitive characteristics of capacitor structure 10 depend upon geometries defined by the holes. Hole geometries depend upon the nature of the design specifications of a device incorporating capacitor structure 10.

Figure 6:
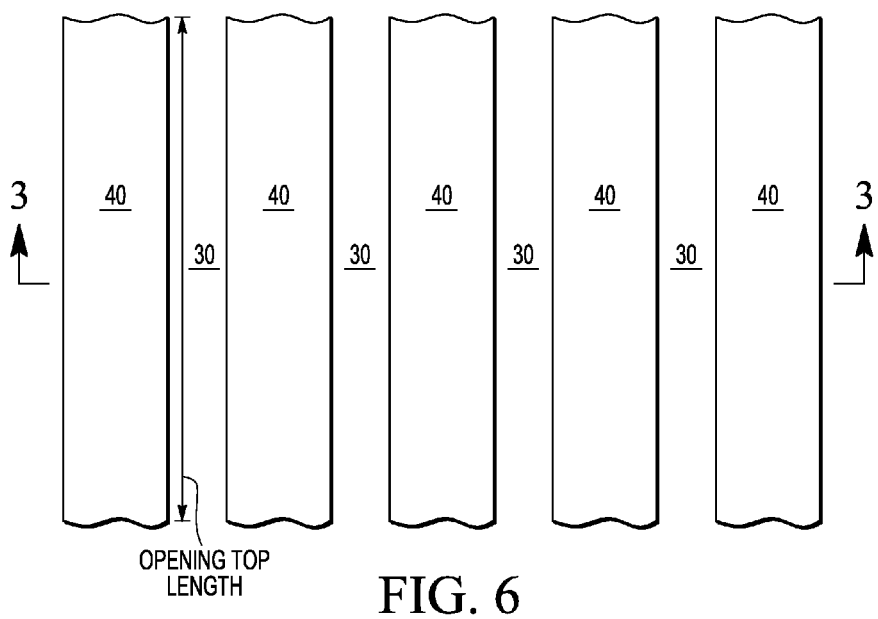
FIG. 6 is a simplified block diagram illustrating one example of hole geometries for a silicon-containing conductive layer, usable by embodiments of the present invention.

FIG. 6 is a simplified block diagram illustrating one example of hole geometries, usable by embodiments of the present invention. FIG. 6 is an overhead view of capacitor structure 10 from FIG. 3, after an etch has been performed on the silicon-containing conductive layer. In the illustrated embodiment, lines or linear trenches are etched into silicon-containing conductive layer 40. After etching, regularly spaced linear regions of silicon-containing conductive layer 40 remain, separated by lines or linear trenches extending to a depth of dielectric layer 30. As discussed with regard to FIG. 3, the width of the linear regions of silicon-containing conductive layer 40 is PW. The lines or linear trenches are formed by patterning mask layer 50 with desired widths for PW and resulting hole opening top widths in mind. Each line or linear trench has an opening top length defined along the line or linear trench's longest dimension. In one embodiment, the opening top length is at least five times greater than the opening top width.

Using such a linear hole geometry, capacitance per unit area of the footprint of the capacitor structure can be double that of a capacitor structure that does not have the linear holes in a middle conductive layer. Improvement in capacitance due to inclusion of linear holes, as in embodiments of the present invention, can depend, for example, upon the opening top width and a ratio between the opening top width and the opening bottom width (e.g., hole taper). As stated above, in one embodiment of the present invention, the opening top width is at least double the thickness of dielectric layer 70 (e.g., 200-300 angstroms). As the opening top width is increased, the realized improvement of capacitance decreases. This is due, in part, to a decrease in the area of horizontally opposed silicon-containing conductive layers (e.g., PW decreases and therefore capacitive area along the top of silicon-containing conductive layer 40 decreases). In addition, as the difference between the opening top width and the opening bottom width increases (e.g., the amount of taper to a hole increases), there is an increase in the improvement of capacitance. This is due, in part, to an increase in the capacitive area of the sidewalls of the linear hole, as well as a decrease in area of dielectric layer 30 not covered by silicon-containing conductive layer 40.

Figure 7:
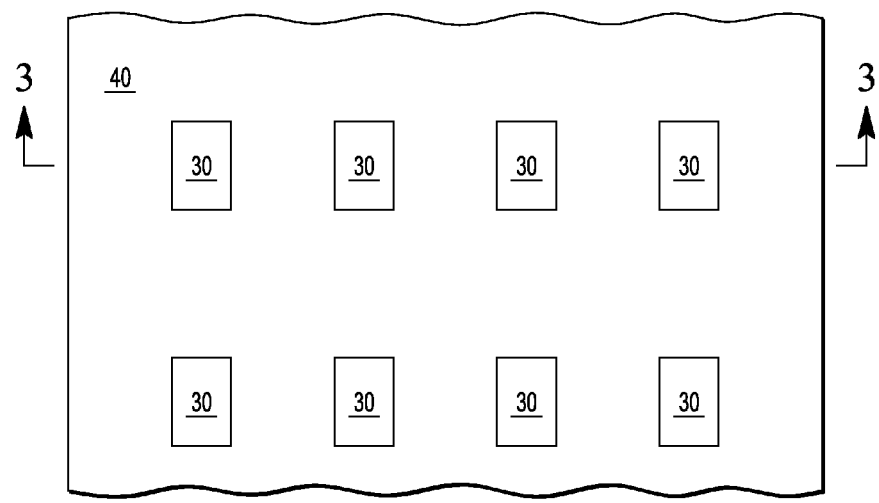
FIG. 7 is a simplified block diagram illustrating another example of hole geometries for a silicon-containing conductive layer, usable by embodiments of the present invention.

FIG. 7 is a simplified block diagram illustrating another example of hole geometries, usable by embodiments of the present invention. FIG. 7 is an overhead view of capacitor structure 10 from FIG. 3, after an etch has been performed on the silicon-containing conductive layer. In the illustrated embodiment, holes in a waffle pattern are etched into silicon-containing conductive layer 40 (a "waffle capacitor structure"). After etching, regularly spaced square holes are etched into silicon-containing conductive layer 40, extending to dielectric layer 30. As discussed with regard to FIG. 3, the width of the regions of silicon-containing conductive layer 40 between the holes is PW. The holes are formed by patterning mask layer 50 with desired widths for PW and hole opening top widths in mind.

As with the linear hole geometry, capacitance per unit area of the footprint of the waffle capacitor structure can be as much as double over a capacitor structure that does not have holes in the middle conductive layer. The waffle capacitor structure is less sensitive than the linear structure to an increase in opening top width, decreasing in improved capacitance at approximately one-third the rate of the linear structure. The waffle capacitor structure is also less sensitive than the linear structure to an increase in the difference between the opening top width and the opening bottom width. But instead of an increase in improved capacitance, as discussed with the linear structure, the waffle capacitor structure experiences a decrease in improved capacitance. This decrease is due, in part, to a decrease in side wall area of the holes as the top-to-bottom taper of the hole increases while the hole opening is held constant.

Figure 8:
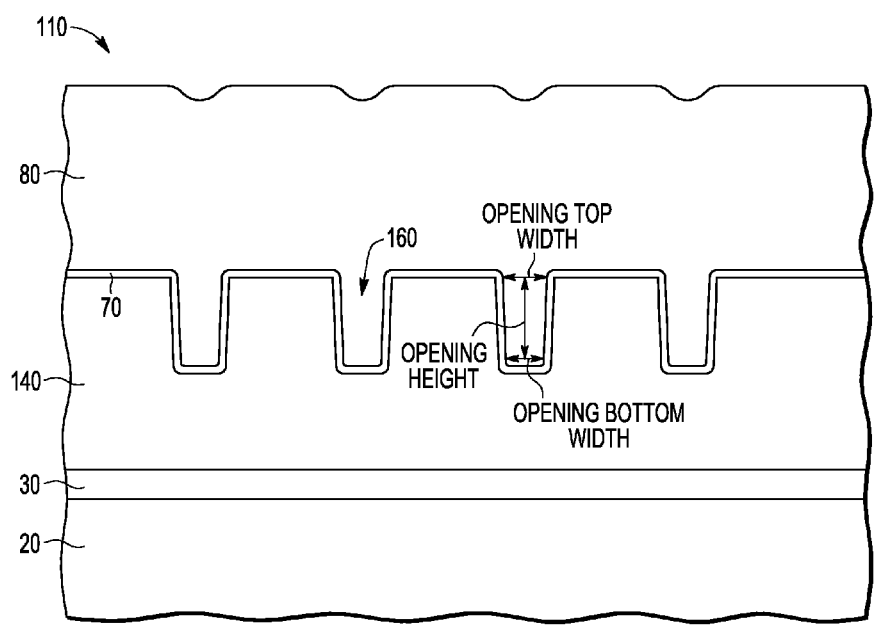
FIG. 8 is a simplified block diagram illustrating an alternative embodiment for a capacitor structure, according to one embodiment of the present invention.

FIG. 8 is a simplified block diagram illustrating an alternative embodiment for a capacitor structure 110, according to one embodiment of the present invention. In the illustrated embodiment, etching of silicon-containing conductive layer 140 is timed to stop prior to reaching the depth of dielectric layer 30. Thus, a portion of silicon-containing conductive layer 140 remains below the bottom of a hole (e.g., hole 160). Formation of dielectric layer 70 and silicon-containing conductive layer 80 is performed as with the embodiment discussed in FIGS. 4 and 5.

Due to the portion of silicon-containing conductive layer 140 being present below the bottom of hole 160, additional capacitive area is realized compared to the embodiment in FIG. 5. There is capacitive area between the portion of silicon-containing conductive layer 140 beneath a hole and the substrate 20. There is also capacitive area between the portion of silicon-containing conducive layer 140 beneath the hole and the portion of silicon-containing conductive layer 80 above the bottom of the hole.

An increase in improved capacitance with capacitor structure 110 will be less sensitive to changes in opening top width than capacitor structure 10 discussed above. This is due, in part, to a more consistent amount of "horizontal" capacitive area between silicon-containing conductive layer 140 and both substrate 20 and silicon-containing conductive layer 80. Thickness of the portion of silicon-containing conductive layer 140 beneath a hole need only be sufficient to maintain a conductive region between areas of silicon-containing conductive layer 140 forming the hole in order for this effect to be realized.

In the above discussion, specific geometries of holes etched in silicon-containing conductive layer 40 (and 140) have been discussed. It should be realized that these geometries of holes, and the silicon-containing conductive layer itself, are presented as examples of effective means for forming additional capacitive area. Other geometries for holes may be used to realize the improvements of embodiments of the present invention, and the scope of the present invention is not limited by discussion of specific hole and structure geometries.

Through the above process, a method for forming a capacitor structure having increased capacitance per footprint unit area has been described. In one embodiment of the present invention, the method includes forming a first dielectric layer over a substrate and forming a first silicon-containing layer over the first dielectric layer. A masking layer is then formed over the first silicon-containing layer and an etch is performed to form a plurality of openings in the first silicon-containing layer. The embodiment further includes forming a second dielectric layer over the first silicon-containing layer and within the formed openings, and then forming a second silicon-containing layer over the second dielectric layer and filling each of the plurality of openings. In the above embodiment, upon the formation of the second dielectric layer, each opening has an opening top width and an opening height, wherein the opening height is greater than or equal to the opening top width. In one aspect of this embodiment, the second dielectric layer can be formed by forming a first oxide layer over the first silicon-containing layer, a nitride over the first oxide layer, and a second oxide layer over the nitride layer.

In one aspect of the above embodiment, forming the plurality of openings in the first silicon-containing layer is performed such that each of the plurality of openings exposes the first dielectric layer. In another aspect of the above embodiment, subsequent to forming the second dielectric layer, each of the plurality of openings has an opening height that is greater than or equal to 1.5 times the opening top width.

In another aspect of the above embodiment, the first silicon-containing layer, the first dielectric layer, and the substrate form a first capacitance of the capacitor structure, while the first silicon-containing layer, the second dielectric layer and the second silicon-containing layer form a second capacitance of the capacitor structure. In a further aspect, the first capacitance is in parallel with the second capacitance.

In another aspect of the above embodiment, the plurality of openings in the first silicon-containing layer are formed as a grid of openings. In still another aspect of the above embodiment, the plurality of openings in the first silicon-containing layer are formed such that each of the plurality of openings has an opening top length that is at least five times greater than the opening top width. In a further aspect, the plurality of openings are formed parallel to one another.

In another embodiment of the present invention, a capacitor structure is formed by forming a first dielectric layer over a substrate, forming a first silicon-containing layer over the first dielectric layer, forming a plurality of openings in the first silicon-containing layer, forming a second dielectric layer over the first silicon-containing layer and within each of the openings, and forming a second silicon-containing layer over the second dielectric layer, wherein the second silicon-containing layer fills each of the openings. In this embodiment, after forming the second dielectric layer, each of the plurality of openings has an opening top width and an opening height, wherein the opening top width is greater than twice a thickness of the second dielectric layer.

In one aspect of the above embodiment, forming the plurality of opening is performed such that each of the plurality of openings exposes the first dielectric layer. In another aspect of the above embodiment, forming the second dielectric layer is performed such that after forming the second dielectric layer, each of the plurality of opening has an opening height that is greater than or equal to the opening top width.

In one aspect of the above embodiment, the first silicon containing layer, the first dielectric layer and the substrate form a first capacitance of the capacitor structure, and the first silicon-containing layer, the second dielectric layer and the second silicon-containing layer form a second capacitance of the capacitor structure. In a further aspect, the first capacitance is in parallel with the second capacitance.

In another aspect of the above embodiment, forming the plurality of openings is performed such that the plurality of openings form a grid of openings in the first silicon-containing layer. In another aspect of the above embodiment, forming the plurality of openings is performed such that each of the plurality of openings has an opening top length that is at least ten times greater than the opening top width. In a further aspect, forming the plurality of these openings is performed such that the plurality of openings are parallel to each other.

In another aspect of the above embodiment, forming the plurality of openings is performed by forming a patterned masking layer over the first silicon-containing layer, and then performing an etch using the patterned masking layer.

In another embodiment of the present invention, a capacitor structure includes a first dielectric layer over a semiconductor substrate, a first silicon-containing layer having a plurality of openings is disposed over the first dielectric layer, a second dielectric layer disposed over the first silicon-containing layer and within the plurality of openings, and a second silicon-containing layer disposed over the second dielectric layer, which fills each of the plurality of openings. With the second dielectric layer within each of the plurality of openings, each of the plurality of openings has an opening top width and an opening height, wherein the opening top width is greater than twice a thickness of the second dielectric layer. Further, the first silicon-containing layer, the first dielectric layer, and the substrate form a first capacitance of the capacitor structure, and the first silicon-containing layer, the second dielectric layer, and the second silicon-containing layer form a second capacitance of the capacitor structure, wherein the first and second capacitances are in parallel. In one aspect of this embodiment, each of the plurality of openings extends through the first silicon-containing layer to the underlying first dielectric layer.

Through the use of embodiments of the present invention, higher capacitances structures can be realized for the same footprint area on a device. Further, since the structures can be formed using dielectric layers that are used in traditional capacitors, inclusion of the capacitor structures of the present invention can be had without additional processing costs.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the described holes in silicon-containing layer 40 can be regularly spaced or irregularly spaced. Further, the described holes can be of a variety of shapes, rather than the described squares (e.g., for the waffle geometry described for FIG. 7). Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a capacitor structure, the method comprising:
   forming a first dielectric layer over a substrate;
   forming a first silicon-containing layer over the first dielectric layer;
   forming a patterned masking layer over the first silicon-containing layer;
   performing an etch using the patterned masking layer to form a plurality of openings in the first silicon-containing layer, wherein after said performing the etch each opening has a depth that does not expose the first dielectric layer;
   forming a second dielectric layer over the first silicon-containing layer and within each of the plurality of openings in the first silicon-containing layer, wherein, after forming the second dielectric layer, each of the plurality of openings has an opening top width and an opening height and the opening height is greater than or equal to the opening top width; and
   forming a second silicon-containing layer over the second dielectric layer, wherein the second silicon-containing layer fills each of the plurality of openings.

2. The method of claim 1, wherein the forming the second dielectric layer over the first silicon-containing layer is performed such that, after the forming the second dielectric layer, each of the plurality of openings has an opening height that is greater than or equal to 1.5 times the opening top width.

3. The method of claim 1, wherein
   the first silicon-containing layer, the first dielectric layer, and the substrate form a first capacitance of the capacitor structure, and
   the first silicon-containing layer, the second dielectric layer, and the second silicon-containing layer form a second capacitance of the capacitor structure.

4. The method of claim 3, wherein the first capacitance is in parallel with the second capacitance.

5. The method of claim 1, wherein the forming the plurality of openings in the first silicon-containing layer is performed such that the plurality of openings form a grid of openings in the first silicon-containing layer.

6. The method of claim 1, wherein the forming the plurality of openings in the first silicon-containing layer is performed such that each of the plurality of openings has an opening top length that is at least five times greater than the opening top width.

7. The method of claim 6, wherein the forming the plurality of openings in the first silicon-containing layer is performed such that the plurality of openings are parallel to each other.

8. The method of claim 1, wherein the forming the second dielectric layer comprises:
forming a first oxide layer over the first silicon-containing layer;
forming a nitride layer over the first oxide layer; and
forming a second oxide layer over the nitride layer.

9. A method for forming a capacitor structure, the method comprising:
forming a first dielectric layer over a substrate;
forming a first silicon-containing layer over the first dielectric layer;
forming a plurality of openings in the first silicon-containing layer, wherein after said forming the plurality of openings, the openings are a depth that does not expose the first dielectric layer;
forming a second dielectric layer over the first silicon-containing layer and within each of the plurality of openings in the first silicon-containing layer, wherein, after forming the second dielectric layer, each of the plurality of openings has an opening top width and an opening height and the opening top width is greater than twice a thickness of the second dielectric layer; and
forming a second silicon-containing layer over the second dielectric layer, wherein the second silicon-containing layer fills each of the plurality of openings.

10. The method of claim 9, wherein the forming the second dielectric layer over the first silicon-containing layer is performed such that, after the forming the second dielectric layer, each of the plurality of openings has an opening height that is greater than or equal to the opening top width.

11. The method of claim 9, wherein
the first silicon-containing layer, the first dielectric layer, and the substrate form a first capacitance of the capacitor structure, and
the first silicon-containing layer, the second dielectric layer, and the second silicon-containing layer form a second capacitance of the capacitor structure.

12. The method of claim 11, wherein the first capacitance is in parallel with the second capacitance.

13. The method of claim 9, wherein the forming the plurality of openings in the first silicon-containing layer is performed such that the plurality of openings form a grid of openings in the first silicon-containing layer.

14. The method of claim 9, wherein the forming the plurality of openings in the first silicon-containing layer is performed such that each of the plurality of openings has an opening top length that is at least five times greater than the opening top width.

15. The method of claim 14, wherein the forming the plurality of openings in the first silicon-containing layer is performed such that the plurality of openings are parallel to each other.

16. The method of claim 9, wherein the forming the plurality of openings in the first silicon-containing layer comprises:
forming a patterned masking layer over the first silicon-containing layer; and
performing an etch using the patterned masking layer to form the plurality of openings.

17. A capacitor structure, comprising:
a first dielectric layer over a semiconductor substrate;
a first silicon-containing layer over the first dielectric layer, wherein the first silicon-containing layer includes a plurality of openings that have a depth that does not expose the first dielectric layer;
a second dielectric layer over the first silicon-containing layer and within each of the plurality of openings in the first silicon-containing layer, wherein, with the second dielectric layer within each of the plurality of openings, each of the plurality of openings has an opening top width and an opening height and the opening top width is greater than twice a thickness of the second dielectric layer; and
a second silicon-containing layer over the second dielectric layer, wherein the second silicon-containing layer fills each of the plurality of openings, and wherein:
the first silicon-containing layer, the first dielectric layer, and the substrate form a first capacitance of the capacitor structure, and
the first silicon-containing layer, the second dielectric layer, and the second silicon-containing layer form a second capacitance of the capacitor structure which is in parallel with the first capacitance of the capacitor structure.

* * * * *